(12) United States Patent
Robotham, Jr. et al.

(10) Patent No.: US 7,605,673 B2
(45) Date of Patent: Oct. 20, 2009

(54) TRANSFORMER FOR IMPEDANCE-MATCHING POWER OUTPUT OF RF AMPLIFIER TO GAS-LASER DISCHARGE

(75) Inventors: W. Shef Robotham, Jr., Burlington, CT (US); Frederick W. Hauer, Windsor, CT (US); Leon A. Newman, Glastonbury, CT (US)

(73) Assignee: Coherent, Inc., Santa Clara, CA (US)

( * ) Notice: Subject to any disclaimer, the term of this patent is extended or adjusted under 35 U.S.C. 154(b) by 70 days.

(21) Appl. No.: 11/805,542

(22) Filed: May 23, 2007

(65) Prior Publication Data

US 2007/0279035 A1 Dec. 6, 2007

Related U.S. Application Data

(60) Provisional application No. 60/810,538, filed on Jun. 2, 2006.

(51) Int. Cl.
*H03H 7/38* (2006.01)
(52) U.S. Cl. .......................... 333/33; 333/112; 333/26
(58) Field of Classification Search .................. 333/26, 333/33, 116, 25, 202, 112, 109; 330/295, 330/195, 301, 276, 286; 323/355
See application file for complete search history.

(56) References Cited

U.S. PATENT DOCUMENTS 3,846,721 A * 11/1974 Fritz et al. .................... 333/26

4,186,352 A * 1/1980 Hallford ..................... 455/327
4,999,597 A 3/1991 Gaynor ...................... 333/246
5,015,972 A 5/1991 Cygan et al. ................. 333/32

(Continued)

FOREIGN PATENT DOCUMENTS

WO WO 01/37323 A2 5/2001

OTHER PUBLICATIONS

B. Becciolini, "Impedance Matching Networks Applied to RF Power Transistors," *Motorola Semiconductor Application Note AN721*, Copyright of Motorola (1993), pp. 1-15.
H. Granberg, "Broadband Transformers and Power Combining Techniques for RF," *Motorola Semiconductor Application Note AN749*, Copyright of Motorola (1993), pp. 1-9.
H. Shuhao, "The Balun Family," *Technical Note—Microwave Journal*, Sep. 1987, pp. 227-228.

*Primary Examiner*—James H. Cho
*Assistant Examiner*—Crystal L Hammond
(74) *Attorney, Agent, or Firm*—Morrison & Foerster LLP

(57) ABSTRACT

An RF impedance-matching transformer for matching the output impedance of an RF amplifier to the discharge of a gas-discharge laser includes upper and lower dielectric plates arranged face-to-face and bonded together. A primary U-shaped strip winding is embedded in the bonded surface of one of the dielectric plates. A secondary strip-winding is formed on an exposed surface of the upper dielectric plates. A ground-plane electrode formed on an exposed surface of the lower dielectric plate. An electrical connector connects one end of the secondary strip-winding to the ground-plane electrode via a via-hole extending through the dielectric plates. The other end of the secondary strip-winding can be connected to the laser.

16 Claims, 5 Drawing Sheets

U.S. PATENT DOCUMENTS

| | | | |
|---|---|---|---|
| 5,446,425 A * | 8/1995 | Banba | 333/116 |
| 6,278,340 B1 | 8/2001 | Liu | 333/26 |
| 6,483,397 B2 * | 11/2002 | Catoiu | 333/116 |
| 6,661,306 B2 * | 12/2003 | Goyette et al. | 333/25 |
| 6,759,920 B1 * | 7/2004 | Cheung et al. | 333/25 |
| 7,190,240 B2 * | 3/2007 | Podell | 333/109 |
| 7,245,192 B2 * | 7/2007 | Podell | 333/112 |
| 2001/0051276 A1 * | 12/2001 | Kim | 428/442 |
| 2006/0087384 A1 | 4/2006 | Ezzendine | 333/26 |
| 2006/0091958 A1 | 5/2006 | Bhatti et al. | 330/295 |

\* cited by examiner

TRANSFORMER FOR IMPEDANCE-MATCHING POWER OUTPUT OF RF AMPLIFIER TO GAS-LASER DISCHARGE

PRIORITY CLAIM

The present application claims priority from U.S. Provisional Application No. 60/810,538, filed on Jun. 2, 2006, by Robotham et al., titled "Transformer for Impedance-Matching Power Output of RF Amplifier to Gas-Laser Discharge." U.S. Provisional Application No. 60/810,538 is hereby incorporated herein by reference in its entirety.

TECHNICAL FIELD OF THE INVENTION

The present invention relates in general to radio-frequency (RF) gas-discharge lasers and, in particular, to a transformer for matching the output of an RF amplifier to the gas discharge in such a laser.

DISCUSSION OF BACKGROUND ART

The cost of solid-state RF power supplies used for $CO_2$ lasers is approximately equal to the cost of the laser head. It is well known to those skilled in the art that, as the RF laser excitation frequency of the power supply is increased, the amount of RF power that can be coupled into the laser's gas discharge can be increased to a higher value without developing arcs within the discharge volume. Arcs within the discharge are detrimental to $CO_2$ laser performance. It is also well known that, as the RF frequency is increased, the discharge can be operated at higher pressures while still maintaining a uniform discharge. Both of these higher frequency benefits enable higher laser output power to be obtained from a given-size laser head.

Unfortunately, as the RF frequency of the solid-state power supply is increased, the design, assembly and cost of the power supply increases. Laser manufacturers are forced to make compromises between benefits in decreased laser size for a given laser power output, versus the disadvantages associated with design, assembly and higher cost associated with the use of higher-frequency solid-state power supplies.

Typically, frequencies in the VHF band (e.g. 30 to 300 MHz) are utilized in sealed-off, RF excited, diffusion cooled $CO_2$ lasers, with the frequencies between 30 MHz and 100 MHz being most common.

RF power supplies for the above-discussed lasers usually include a master oscillator and at least one stage of amplification. One of the more challenging tasks in designing RF power supplies for $CO_2$ lasers is the matching between the final RF amplifier and the laser discharge. The final RF amplifier may require impedances as low as 5-10 Ohms, while the transmission line carrying RF power to the discharge has an impedance that is typically 50 Ohms. The laser discharge impedance is in the order of 50 Ohms after ignition for laser power of 100 W. The power drops for higher power $CO_2$ lasers. This match must be efficient such that minimum RF power is lost within the impedance transformation. In addition, the impedance of the un-lit discharge is much higher than for the lit discharge. Consequently, there is a large mismatch prior to the discharge being lit. Additionally, the match must be able to withstand the possible high voltages generated during the process of igniting the discharge. Since to light the discharge requires a higher voltage than to keep it running after ignition, the ignition is usually performed with a high voltage pulse or a series of fast pulses. Transmission line transformers are inherently broadband so that they can deliver the high voltage "spikes" and they are also very efficient under continuous wave (CW) operation. Consequently, they are presently the preferred choice for this application. As discussed in detail below, the present invention provides a transformer design that maintains these characteristics and provides additional benefits.

Another challenging task is matching the relatively high output impedance (i.e. typically 50 ohms) of the electronic oscillator circuitry feeding into the relatively low input impedance (i.e. typically several ohms) of the input to the first stage of the RF power amplifier chain. The present invention can also be used to address this challenge.

The most mature RF impedance matching transformer technology is the use of wire wound on ferrite cores. This technology dates back to the middle 1950's and is commonly used at lower RF frequencies (i.e. below 80 MHz) as ferrite transformers tend to be lossey at higher RF frequencies (i.e. above 80 MHz). At high RF power levels (say, above 300 W) and for frequencies above 80 MHz, the loss within the ferrite creates a thermal problem and, therefore, adds further design complexity and cost to the RF supply. Many users of $CO_2$ lasers having up to approximately 100 W of output power usually desire to have the laser's RF power supply mounted directly on the laser head. The totally self-contained laser and power supply allows the user to avoid dealing with a co-axial cable connecting the laser head to a remotely located RF power supply. This desire is especially strong in applications that require the laser to be mounted on a robotic arm.

Cooling the ferrite transformers within RF power supplies mounted directly on laser heads is especially difficult when air cooling is desired. In addition to the loss at higher RF frequencies, ferrite transformers tend to have larger height, width and depth dimensions than other components on the printed circuit board (PCB).

The electrical characteristics of ferrite transformers vary from unit to unit so as to require special sorting before being used in a PCB assembly. The sorting results in special tuning steps required during power supply assembly. The sorting, assembly tuning and thermal management raise the final cost of the laser and are major disadvantages of this technology.

FIG. 1A schematically shows a co-axial cable 100 that includes an outer conductor 102 and an inner conductor 104 with a dielectric 106 separating the two conductors. FIG. 1B is a schematic illustration of a 1-to-4 step-up co-axial transformer frequently used in RF power supplies to drive sealed-off, diffusion cooled $CO_2$ laser discharges. Such transformers are presently used in commercially available 100 MHz power supplies driving 20 W to 100 W $CO_2$ wave-guide laser discharges. FIG. 1C shows a schematic of the physical electrical connections between two co-axial cables of equal length L to form the 1-to-4 step-up transformers shown in FIG. 1B.

The advantages of the co-axial transformers over the ferrite transformer approach are lower cost, lower RF losses and the capability of higher frequency operation. Unfortunately, the co-axial transformer technology shares some of the same disadvantages associated with ferrite transformer technology. These disadvantages are: the need to mount, restrain, and connect the transformer onto the PCB; the completed transformer has a relatively large height dimension when compared to the other components on the PCB; and its electrical characteristics are strongly related to position and manner of connection to the PCB. The last issue is the one of most concern.

SUMMARY OF THE INVENTION

The present invention enables the use of a combination of buried micro-strip and coupled micro-strip technology to achieve high RF frequency step-up or step-down transformers. The disclosed technology overcomes most of the disadvantages of the well-established ferrite and semi-rigid co-axial transmission line transformers technology with reduced over-all cost, increased repeatability, and increased reliability.

A transformer in accordance with one embodiment of the present invention comprises first and second dielectric plates each having an upper surface and a lower surface. The lower surface of the first dielectric plate is non-conductively bonded to the upper surface of the second dielectric plate. A primary transformer winding in the form of an electrically conductive strip is embedded in the upper surface of the second dielectric plate. A secondary transformer winding in the form of an electrically conductive strip is formed on the upper surface of the first dielectric plate. A ground plane electrode is formed on the lower surface of the second dielectric plate. An electrical connector connects the secondary transformer winding to the ground plane electrode via a via-hole extending through the first and second dielectric plates.

In one example of the inventive transformer for providing an about one-to-two impedance matching ratio (e.g., a step-up ratio), the primary transformer winding has one, generally U-shaped turn, and has a first strip-width. The secondary transformer winding has about two, coplanar turns, and has a second strip-width that is less than one-half of the first strip-width. The primary and secondary windings are arranged face-to-face with the secondary transformer winding overlapping the primary transformer winding. The terms "about one turn" and "about two turns" as used above mean that the number of turns need not be complete turns or that the strip length may be more than needed to form the stated number of turns. In this example, a higher step-up ratio may be achieved using more than about two turns cooperative with the U-shaped primary winding. By way of example, a secondary winding having about two secondary turns may be used to achieve a step-up ratio of about one-to-four. The strip width of the secondary winding in this case would be less than one-quarter of the primary strip-width.

The features and advantages of the various aspects of the present invention will be more fully understood and appreciated upon consideration of the following detailed description of the invention and the accompanying drawings, which set forth illustrative embodiments in which the concepts of the invention are utilized.

DETAILED DESCRIPTION OF THE INVENTION

Figure 1A:
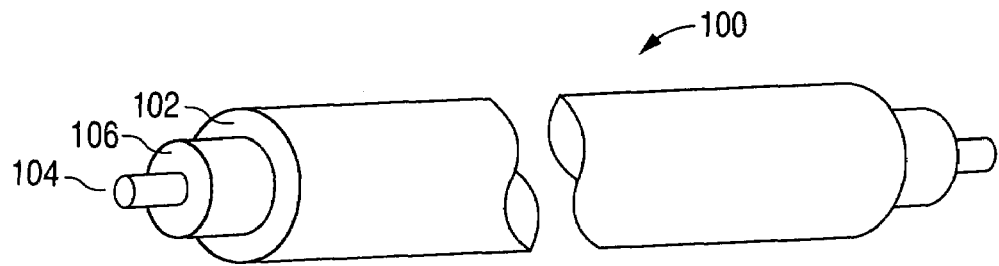
FIG. 1A shows a conventional co-axial transmission line cable.
Figure 1B:
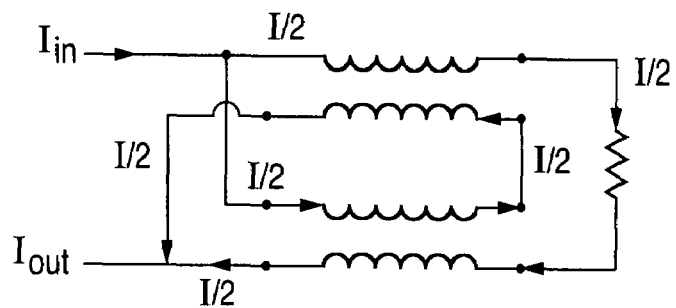
FIG. 1B is a schematic drawing illustrating an impedance transformer for use with a co-axial cable transmission line.
Figure 1C:
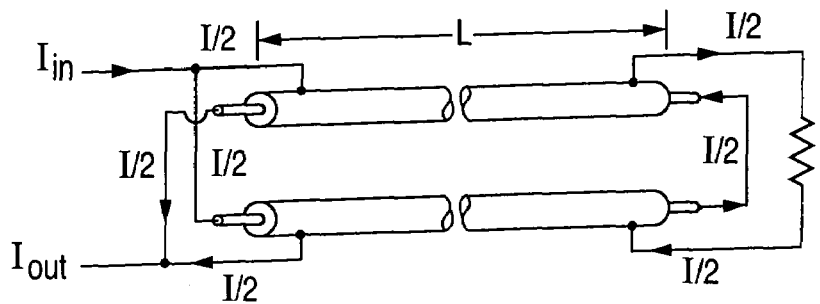
FIG. 1C is a schematic drawing illustrating the physical electrical connections for 1 1-to-4 steep-up co-axial transformer.
Figure 2:
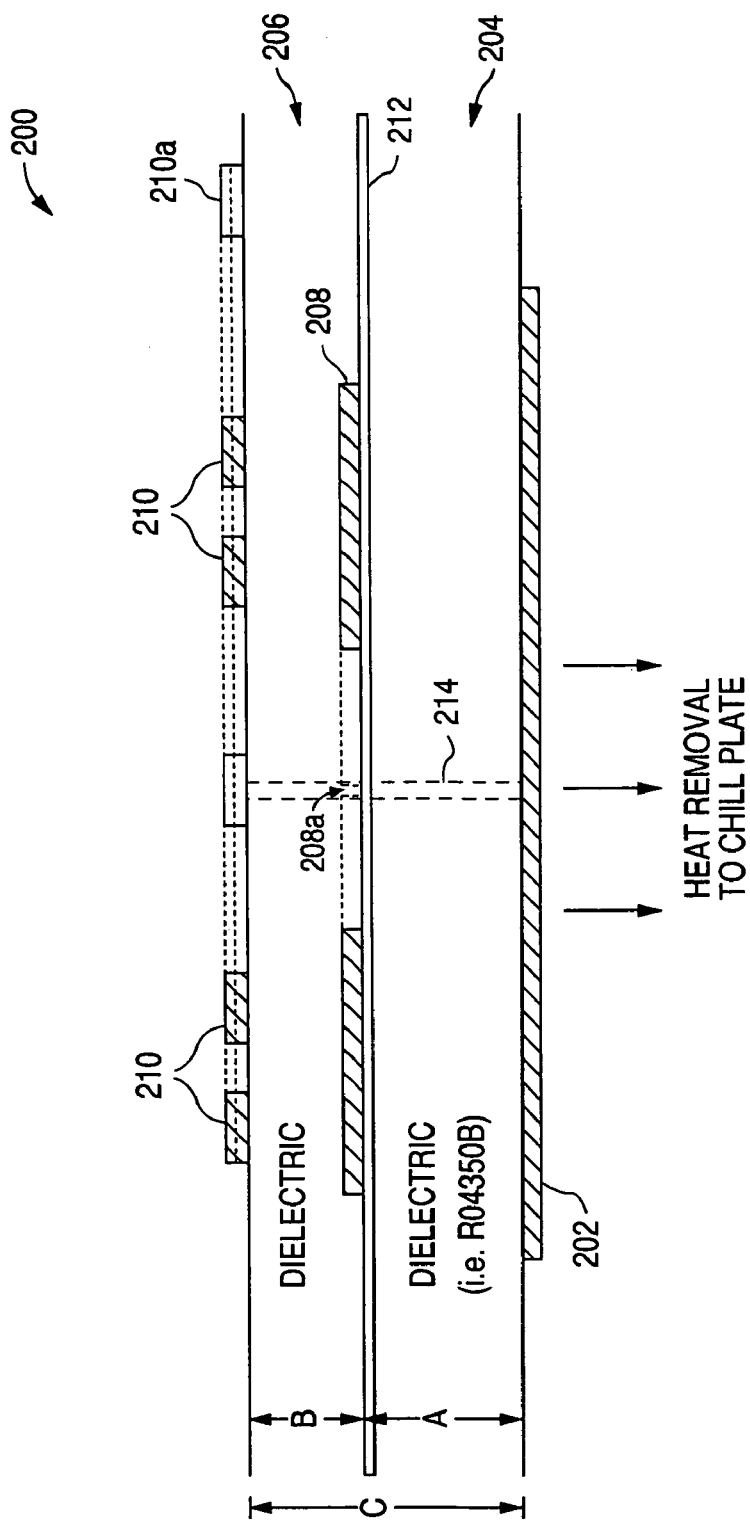
FIGS. 2 and 2A are cross section drawings illustrating an embodiment of an impedance matching transformer in accordance with the present invention.
Figure 2A:
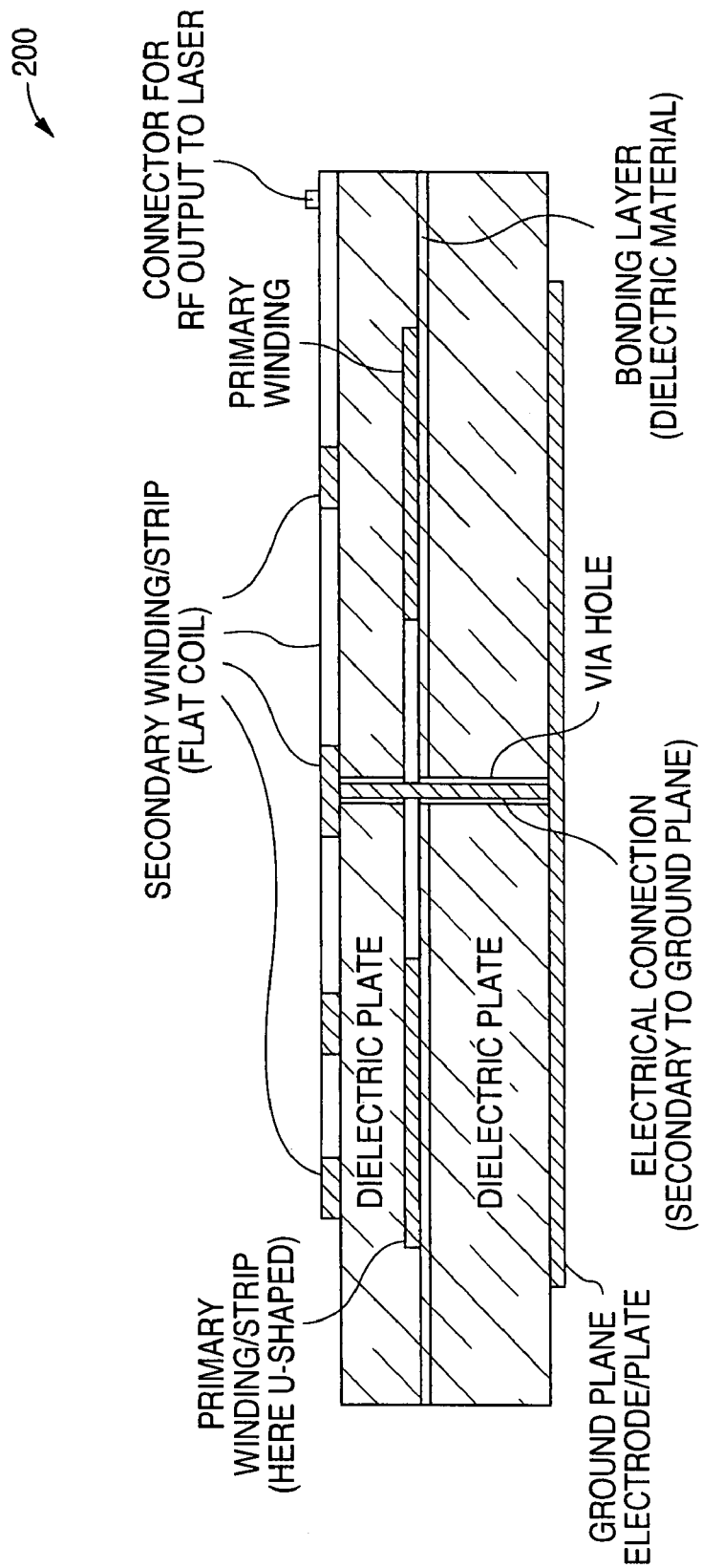

FIGS. 2 and 2A schematically illustrate in cross-section an embodiment of a buried micro-strip/coupled micro-strip impedance matching transformer 200 in accordance with the present invention for driving a $CO_2$ laser discharge. The transformer 200 includes an electrical conductor 202, such as copper, deposited on the bottom of a high thermal conductivity, low RF loss dielectric, printed circuit board (PCB) material 204, such as, for example, RO4350B manufactured by Rogers Corporation. The copper 202 serves as an electrical ground plane and for making good thermal contact to a chill plate (not shown) to conduct heat away from the transformer 200. The dielectric material 204 upon which the metal electrical ground plane 202 is deposited has a thickness "A".

A second dielectric layer 206 of thickness "B" is copper plated on both sides and etched on both sides to obtain patterns of thin metal layers that form both the primary winding 208 and the secondary winding 210 of the transformer 200. This second dielectric layer 206 is thin so as to provide good inductive coupling between the primary 208 and secondary 210 tracks. The primary 208 is formed in the shape of a wide horse-shoe or U-shape, while the secondary 210 overlays the primary 208 on the opposite side of the dielectric 206 and consists of the desired number of overlapping traces. The number of secondary traces determines the turns ratio and, therefore, the impedance transformation. The actual number of secondary turns is only limited by the width of the primary 208 such that suitable coupling may be established between the two metal patterns separated by the thin dielectric 206 of thickness B. This dielectric layer 206, with the finished metal traces forming the primary circuit 208 and the secondary circuit 210 is then laminated onto the first dielectric layer 204 of thickness A. Rogers Corporation supplies the required printed circuit dielectrics, RO4350B and RO4450, and the adhesives used to laminate these two dielectric layers together. The Rogers material is used as an example in this disclosure, but those skilled in the art will appreciate that other high performance dielectric manufacturers material's may be substituted.

As shown in FIG. 2, the lamination of the two dielectric layers 204, 206 results in a PCB structure of height "C" including the thickness of the interlayer binding material 212. At the back end of the primary pattern, a connector is provided for connecting a dc power supply voltage, normally 48 volts dc.

The "A" and "B" dimensions of the dielectric 204 an 206, respectively, and the configurations of the primary 208 and secondary 210, such as length, width and thickness, are determined with the use of RF circuit design software tools to obtain the desired impedances and the overall impedance transformation for a desired application. As shown in FIGS. 2 and 2A, a via hole 214 from one end of the secondary coil 210 down to the ground plane 202 is provided to obtain an electrical connection between the two electrical conductors. The other end 210a of the secondary coil 210 serves as the RF output to drive the $CO_2$ laser discharge.

Figure 3:
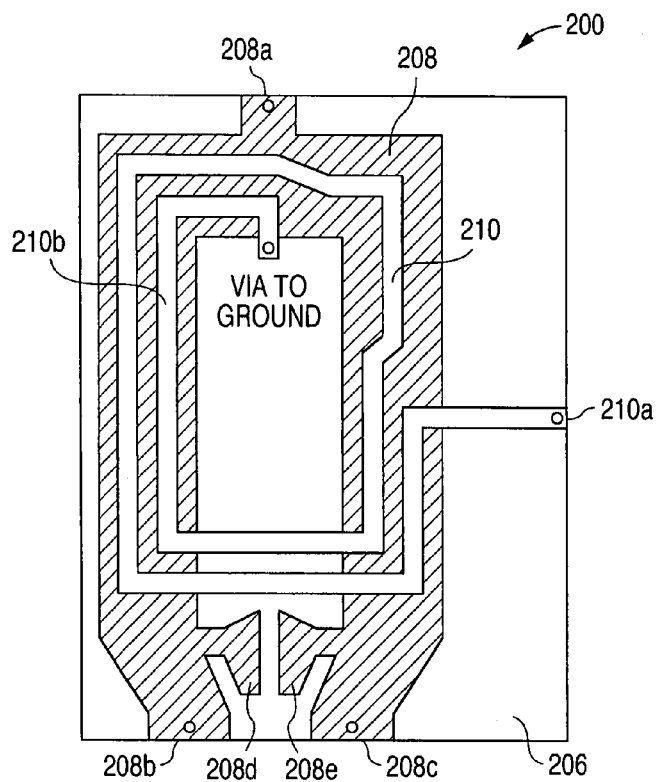
FIG. 3 is a top view drawing illustrating the FIGS. 2/2A transformer.

FIG. 3 provides a top down view of the 1-to-4 step-up, high frequency, RF impedance matching transformer 200 shown in cross-section in FIGS. 2 and 2A. The secondary 210 (shown in white), a 2-turn coil in this case, is clearly seen with the output end 210a of the coil 210 (i.e. to the right in FIG. 3) serving as the output connector feeding the $CO_2$ laser's discharge. The opposite end 210b of the 2-turn coil secondary 210 is located near the center of FIG. 3 (with legend "Via to Ground") and is connected to the ground plane 202 by a via-hole connector, as discussed above and shown in FIGS. 2 and 2A. Underneath the secondary coil 210 is the top surface of the high thermal conductivity, low RF loss upper dielectric 206 of thickness B through which the via hole 214 is formed. The via-hole 214 also goes through the lower dielectric of thickness A.

The wide U-shape, single turn, primary 208 that is deposited on top of the lower dielectric 204 of thickness A is also shown in FIG. 3 (cross-hatched). The tab 208a protruding from the primary 208 at the top of FIG. 3 is the connector to the DC power supply for the power transistors. This voltage is normally 48V dc. At the bottom of FIG. 3 are the two contacts 208b, 208c for connecting the transformer primary to the drains/collectors of two RF power transistors (not shown), which may be operated in a push-pull configuration and in class-C operation for maximum efficiency, as is well know to those skilled in the art. Those skilled in the art will also appreciate that other circuit topologies and class of RF power amplifiers (PA) operation may be used depending on specific design requirements. Two additional tabs 208d and 208e are shown near the drain/collector connections for connection to a reactive element (not shown) for optional fine tuning. It is noted that the drawing of FIG. 3 is approximately 2× scale (i.e. approximately 2¼" long by 1¼" wide) and was designed for a 100 MHz, 1-to-4 step-up transformer 200 delivering approximately 350 W of CW output power into a discharge. This power is sufficient to drive approximately a 35 W $CO_2$ laser. The use of this approach with four transistors to double the delivered power would require two of these transformers, etc.

Figure 4:
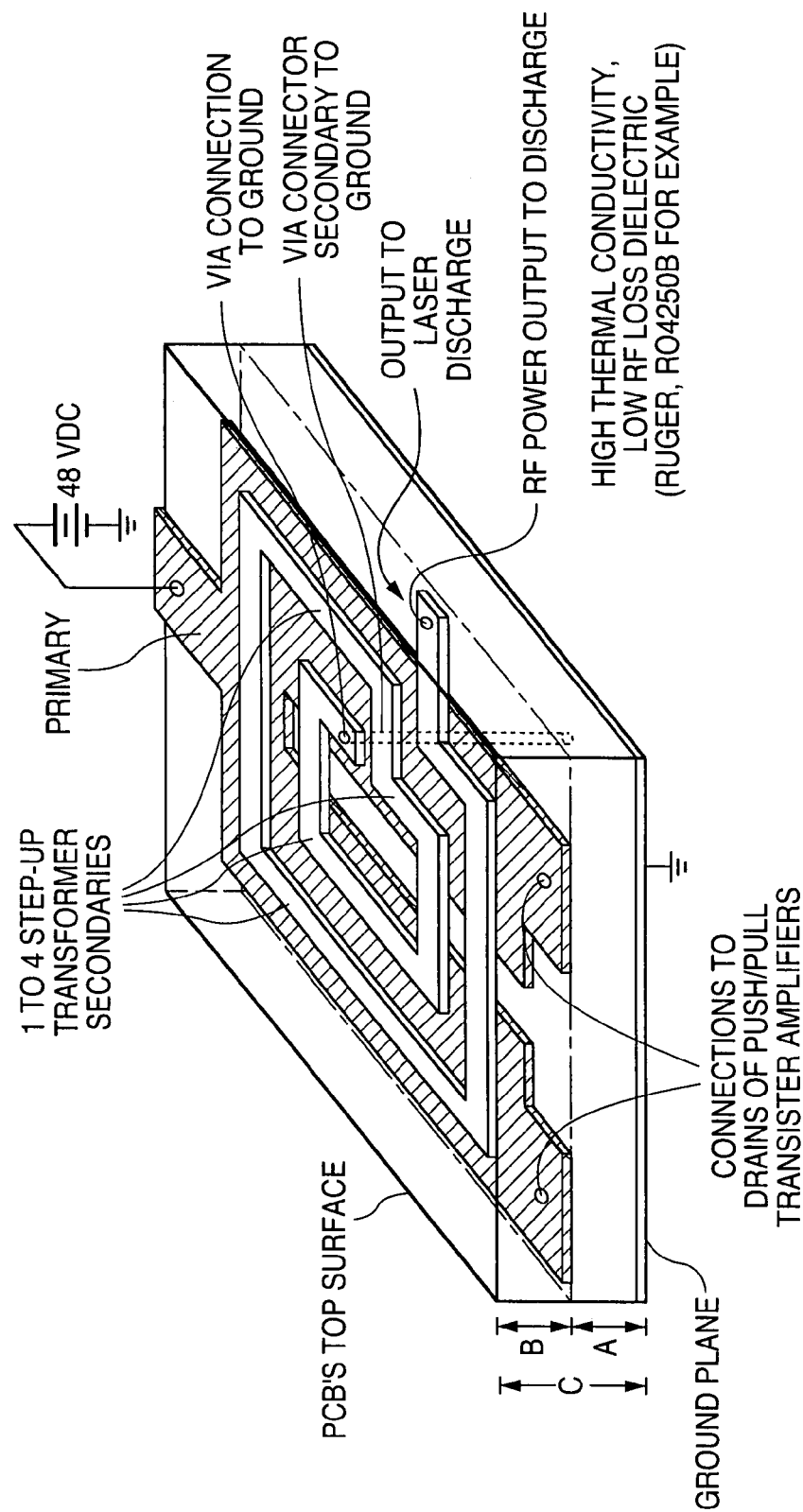
FIG. 4 provides a 3-dimensional illustration of the transformer of FIGS. 2/2A and 3.

FIG. 4 presents a 3-D illustration of the 1-to-4 step-up buried micro-strip/coupled micro-strip line transformer 200 of FIGS. 2, 2A and 3. For a 4-to-1 step-down version for impedance matching, the high output-impedance of digital semiconductor circuitry to the low input-impedance of a typical power transistors, the connections are reversed. In other words, the 2-turn coil coupled micro-strip 210 becomes the primary and the wide, U-shape buried micro-strip 208 becomes the secondary of the transformer. Consequently for this step down case, the digital signal is fed to the connector that serves as the output to the discharge in the step-up case of FIG. 4. For the step-down case, the inputs to the push/pull transistors are provided to the two connectors previously used to connect to the drains/collectors of the transistors.

A proof of principle 100 MHz, 1-to-4 step-up model was designed, constructed and tested. The DC power into the RF PA stage was 450 W. The RF PA plus the invented transformer transmitted 370 W into a 50 ohm load yielding an efficiency of 82%. The hottest spot on the secondary was found to be 75 C with a chill plate temperature of 20 C. Thermal images (not included herein) of each of the transistors showed no visible signs of drain load unbalance. In achieving this performance, the A and B dimensions of the R04450 material were 0.040 inches and 0.10 inches, respectfully. The thickness of the pre-pregnated layers of R4450B material used to bind the top and bottom dielectric together was 0.012 inches.

Figure 5:
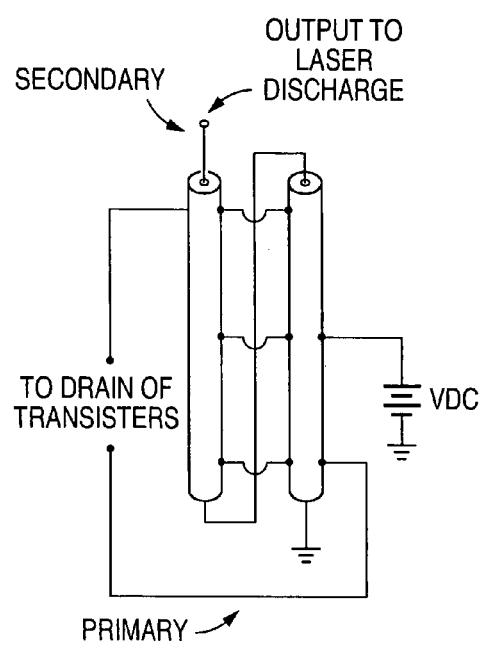
FIG. 5 is a schematic drawing illustrating a co-axial cable transmission line equivalent circuit for the 1-to-4 step-up transformer shown in FIGS, 2, 2A, 3 and 4.

FIG. 5 illustrates a co-axial cable transmission line equivalent circuit for the 1-to-4 step-up transformer 200 illustrated in FIGS. 2, 2A, 3 and 4.

It should be understood that the particular embodiments of the invention described above have been provided by way of example and that other modifications may occur to a person skilled in the art without departing from the spirit and scope of the invention as expressed in the appended claims and their equivalents.

What is claimed is:

1. An RF transformer comprising:
    first and second dielectric plates each having a first surface and a second surface, the first and second dielectric plates having the first surfaces thereof bonded together by a dielectric adhesive material;
    a first transformer winding in the form of a first electrically conductive strip disposed between the first surface of the first dielectric plate and the first surface of the second dielectric plate, wherein the first transformer winding serves as one of either a primary winding or a secondary winding,
    a second transformer winding in the form of a second electrically conductive strip formed on the second surface of the first dielectric plate, said second transformer winding being positioned to at least partially overlie the first transformer winding, and
        wherein the first dielectric plate is sufficiently thin to permit inductive coupling between the first and second transformer windings,
        wherein the second transformer winding serves the other of either a primary or a secondary winding;
        wherein the primary winding has one generally U-shaped turn, and has a first strip width, and
        wherein the secondary winding has two or more turns, and has a second strip width, wherein the product of the number of turns and the second strip width is less than the first strip width;
    a ground plane electrode formed on the second surface of the second dielectric plate; and
    an electrical connector connecting the second transformer winding to the ground plane electrode via a via-hole that extends through the first and second dielectric plates.

2. A transformer as in claim 1, and wherein the first transformer winding overlaps the second transformer winding.

3. A method of making an RF transformer, the method comprising:
    providing first and second dielectric plates each having a first surface and a second surface;
    bonding the first surface of the first dielectric plate to the first surface of the second dielectric plate with a first transformer winding in the form of a first electrically conductive strip disposed between the first and second dielectric plates, wherein the first transformer winding serves as one of either a primary winding or a secondary winding,
    forming a second transformer winding in the form of a second conductive strip on the second surface of the first dielectric plate, said second transformer winding being positioned to at least partially overlie the first transformer winding and
        wherein the first dielectric plate is sufficiently thin to permit inductive coupling between the first and second transformer windings,
        wherein the second transformer winding serves as the other of either a primary or a secondary winding;
        wherein the primary winding has one generally U-shaped turn, and has a first strip width, and
        wherein the secondary winding has two or more turns, and has a second strip width, wherein the product of the number of turns and the second strip width is less than the first strip width;
    forming a ground plane electrode on the second surface of the second dielectric plate; and forming an electrical connector that connects the second transformer winding to the ground plane electrode via a via-hole that extends through the first and second dielectric plates.

4. A method as in claim 3, and wherein the first transformer winding is formed to overlap the second transformer winding.

5. An RF transformer comprising:
first and second dielectric plates each having an upper surface and lower surface, the lower surface of the first dielectric plate being bonded to the upper surface of the second dielectric plate by intervening adhesive material;
a primary winding disposed between the lower surface of the first dielectric plate and the upper surface of the second dielectric plate, the primary winding having one generally U-shaped turn and having a first strip width;
a secondary winding formed on the upper surface of the first dielectric plate, the secondary winding having two or more turns and a second strip width, wherein the product of the number of turns and the second strip width is less than the first strip width, said secondary winding being positioned to at least partially overlie the primary winding and wherein the first dielectric plate is sufficiently thin to permit inductive coupling between the primary and secondary windings;
a ground plane electrode formed on the lower surface of the second dielectric plate; and
an electrical connector that extends through the first and second dielectric plates to connect the secondary winding to the ground plane electrode.

6. An RF transformer as in claim 5, and wherein the primary winding comprises copper.

7. An RF transformer as in claim 6, and wherein the secondary winding comprises copper.

8. An RF transformer as in claim 7, and wherein the ground plane electrode comprises copper.

9. An RF transformer as in claim 5, and wherein the first dielectric plate has a first thickness and the second dielectric plate has a second thickness that is greater than the first thickness.

10. An RF transformer as in claim 5, and wherein the first dielectric plate comprises a material selected from the group consisting of RO4350B and RO4450 material manufactured by Rogers Corporation.

11. An RF transformer as in claim 10, and wherein the second dielectric plate comprises a material selected from the group consisting of RO4350B and RO4450 material manufactured by Rogers Corporation.

12. A method of making an RF transformer, the method comprising:
providing first and second dielectric plates each having an upper surface and a lower surface;
bonding the lower surface of the first dielectric plate to the upper surface of the second dielectric plate using an adhesive material such that a primary winding is disposed between the lower surface of the first dielectric plate and the upper surface of the second dielectric plate, the primary winding having one generally U-shaped turn and a first strip width;
forming a secondary winding on the upper surface of the first dielectric plate, the secondary winding having two or more turns and a second strip width, wherein the product of the number of turns and the second strip width is less than the first strip width, said secondary winding being positioned to at least partially overlie the primary winding and wherein the first dielectric plate is sufficiently thin to permit inductive coupling between the primary and secondary windings;
forming a ground plane electrode on the lower surface of the second dielectric plate; and
forming an electrical connector that extends through the first and second dielectric plates to connect the secondary winding to the ground plane electrode.

13. A method as in claim 12, and wherein the primary winding is formed to include a tab adapted for connection to a DC power supply.

14. A method as in claim 13, and wherein the primary winding is formed to include first and second contacts adapted for connection to first and second RF power transistors, respectively.

15. A method as in claim 14, and wherein the primary winding is formed to include tuning tab structure adapted for connection to an active material for tuning the RF transformer.

16. A method as in claim 15, and wherein the secondary winding is formed to include a first end adapted for connection to a laser discharge and a second end adapted for connection to the electrical connector.

* * * * *